(12) United States Patent
Kernander et al.

(10) Patent No.: US 7,338,707 B2
(45) Date of Patent: Mar. 4, 2008

(54) BRIGHT WHITE PROTECTIVE LAMINATES

(75) Inventors: Carl P. Kernander, Northwood, NH (US); Robert F Davis, Wilmington, DE (US); Frank A. Mannarino, Medway, MA (US); Marina Temchenko, Swampscott, MA (US)

(73) Assignee: Madico, Inc., Woburn, WA (US)

( * ) Notice: Subject to any disclaimer, the term of this patent is extended or adjusted under 35 U.S.C. 154(b) by 0 days.

(21) Appl. No.: 11/451,574

(22) Filed: Jun. 13, 2006

(65) Prior Publication Data

US 2006/0234038 A1    Oct. 19, 2006

Related U.S. Application Data

(63) Continuation-in-part of application No. 10/411,961, filed on Apr. 11, 2003, now abandoned.

(51) Int. Cl.
| | |
|---|---|
| *B32B 15/08* | (2006.01) |
| *B32B 27/08* | (2006.01) |
| *B32B 27/30* | (2006.01) |
| *B32B 27/36* | (2006.01) |
| *H02N 3/00* | (2006.01) |

(52) U.S. Cl. .................. 428/332; 428/422; 428/457; 428/480; 428/522; 136/251; 136/256

(58) Field of Classification Search ........... 136/251, 136/256, 257, 259; 428/332, 335, 421, 422, 428/423.1, 457, 480, 500, 522
See application file for complete search history.

(56) References Cited

U.S. PATENT DOCUMENTS 6,319,596 B1 * 11/2001 Kernander et al. ......... 428/215
6,335,479 B1 * 1/2002 Yamada et al. ............ 136/251

* cited by examiner

*Primary Examiner*—Ramsey Zacharia
(74) *Attorney, Agent, or Firm*—Mathews, Shepherd, McKay & Bruneau, P.A.

(57) ABSTRACT

Laminates of having a first outer layer of weatherable film, at least one mid layer, and a second outer layer containing an opacifying quantity of white pigment. The laminates are particularly useful for protecting photovoltaic cells, solar panels, and circuit boards. In photovoltaic cells, the laminates result in increased power generation.

12 Claims, 2 Drawing Sheets

PVF—

—Adhesive

CTFE—

—Adhesive

EVA—

BRIGHT WHITE PROTECTIVE LAMINATES

CROSS-REFERENCE TO RELATED APPLICATION

This is a Continuation-in-Part of application Ser. No. 10/411,961, filed Apr. 11, 2003, now abandoned.

BACKGROUND OF THE INVENTION

The present invention relates to laminates, and more particularly to thin film laminates. Thin film laminates are useful in many applications, particularly where the properties of one layer of the laminate complement the properties of another layer, providing the laminate with a combination of properties that cannot be obtained in a single layer film.

Photovoltaic (PV) devices are characterized by the efficiency with which they can convert incident solar power to useful electric power. Devices utilizing crystalline or amorphous silicon have achieved efficiencies of 23% or greater. However, efficient crystalline-based devices are difficult and expensive to produce. In order to produce low-cost power, a solar cell must operate at high efficiency.

A number of techniques have been proposed for increasing the efficiency and effectiveness of PV modules. One approach is to enhance light reflection by a protective back sheet for the solar cell.

Japanese Published Patent Application No. 62-10127 suggests providing a solar cell module with a reflective back cover sheet in the form of a laminate comprising a polyester base layer and a light-reflecting aluminum coating, with the back cover sheet having a plurality of V-shaped grooves that provide angular light reflecting facets. The cells are spaced from one another in front of the back sheet, so that incident light passing through the front cover sheet and between the cells is reflected by the back cover sheet back to the transparent front cover sheet.

Gonsiorawski, in U.S. Published Patent Application No. 2004-0035460, teaches production of photovoltaic modules with a back cover sheet of an ionomer/nylon alloy embossed with V-shaped grooves running in at least two directions and coated with a light reflecting medium.

Even though the inventions mentioned above provide a significant power boost, the techniques described are time consuming and expensive. The textured material is produced in several steps. First, the film that serves as the substrate is manufactured as a continuous or extended web having flat front and back surfaces, and that continuous web is then wound onto a roll for subsequent processing. The subsequent processing comprises first embossing the film so as to form V-shaped grooves on one side, and then metallizing the grooved surface of the film. The film is heated so that, as it passes between the two rollers, it is soft enough to be shaped by the ridges on the embossing roller. After formation of grooves, the plastic film is subjected to a metallizing process wherein an adherent metal film is formed. The metallized film is wound on a roll for subsequent use as a light reflector means. Such a process is described in Kardauskas, U.S. Pat. No. 5,994,641.

Laminates described in Kernander et al., U.S. Pat. No. 6,319,596, have at least one outer layer of polyvinyl fluoride and a mid-layer. Such laminates have been used effectively in the preparation of photovoltaic cells, solar panels and circuit boards. Polyester films have been used effectively as a mid-layer in these laminates, alone or in combination with other mid-layers. Such laminates having a polyester mid-layer have been found to be particularly satisfactory for a variety of applications. However, with long-term use, the polyester film or other mid-layer can undergo some degree of degradation. Such degradation typically results in a yellowing of the film, which, while not detrimental to its performance characteristics, is aesthetically undesirable.

A need accordingly remains for a laminate that exhibits high dielectric strength, provides effective protection for the current generated in a photovoltaic module, and which remains aesthetically satisfactory over extended use. In addition, a need exists for a protective laminate, the components of which maximize the pathways for gases formed during the lamination process to escape. Particularly when such laminates are used for backing on photovoltaic cells, it is desirable to have a protective structure that will not interfere with the functioning of the cell, and, if possible, aid in the generation of power.

SUMMARY OF THE INVENTION

The present invention provides laminates that can be used in electronic devices such as photovoltaic (PV) modules, and which satisfy the needs described above. When used as protective backing sheets for PV modules, the present laminates result in an increase of the power output of the module, maximize the pathways for gasses formed during the lamination process, remain aesthetically satisfactory over extended use, provide effective protection for the current generated in the PV module and exhibit high dielectric strength.

Specifically, the present invention provides a laminate comprising
(a) a first outer layer of weatherable film;
(b) at least one mid-layer selected from at least one of the group consisting of (i) poly(chlorotrifluoro ethylene), (ii) polymeric film coated on one or both surfaces with liquid crystal polymer, (iii) liquid crystal polymer; (iv) metal foil; and (v) polyester; and
(c) a second outer layer having a reflectivity of at least about 75.0%.

The present invention also provides articles comprising laminates as described above.

DETAILED DESCRIPTION OF THE INVENTION

Figure 1:
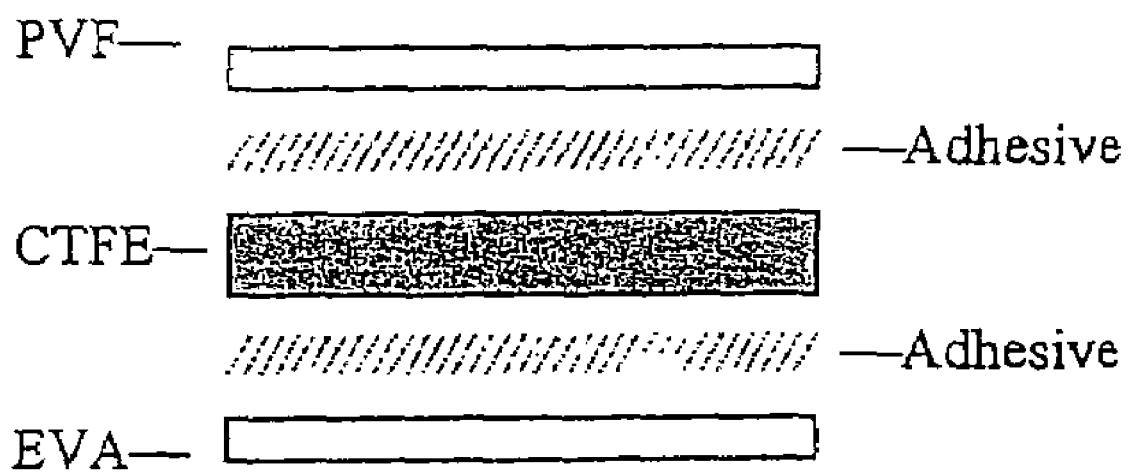
FIG. 1 is a cross-sectional illustration of one embodiment of the laminates of the present invention.

The present invention will be more fully understood by reference to the Figures and the following description. The Figures and description below pertain to preferred embodiments of the present invention. Variations and modifications of these preferred embodiments and other embodiments within the scope of the invention can be substituted without departing from the principles of the invention, as will be evident to those skilled in the art.

The first outer layer of the present laminates comprises a weatherable film, that is, one which withstands exposure to ultraviolet light and exposure to extreme variations of temperature and moisture. Such materials include polyvinylidene fluoride (PVDF), poly pigmented ionomers, aliphatic urethanes, weatherable grade polyesters and polyvinyl fluoride (PVF). PVF films are preferred, of which various grades are commercially available, including pigmented films. In general, the PVF should have a thickness of about from 25 to 75 microns.

The present laminates further comprise at least one mid-layer selected from at least one of the group consisting of (i) poly(chlorotrifluoro ethylene), (ii) polymeric film coated on one or both surfaces with polyvinylidene chloride, (iii) polymeric film coated on one or both surfaces with liquid crystal polymer, (iv) liquid crystal polymer; (v) metal foil; and (vi) polyester. Each of these components is well known in the art. The thickness of the mid-layer will vary with the number and individual thickness of the components of this component, but will typically be about from 2 to 10 mils.

The laminates of the present invention further comprise a second outer layer having a Reflectivity of at least about 75.0%. This reflectivity can be provided with either heavily pigmented ethylene vinyl acetate (EVA) or other polymers, taken alone or coated with light reflecting material.

When pigmented EVA is used for the second outer layer, the vinyl acetate content of the EVA is generally about from 2 to 33 weight percent. An EVA content of about from 2 to 8 weight percent has been found to be particularly satisfactory, and is accordingly preferred. An important aspect of the present invention is that this second outer layer contain about from 3 to 15 weight % white opacifying pigment. Less than about 3% has no substantial effect on power generation, while greater than about 15% results in little additional benefit, and can depreciate the physical characteristics of the film. Concentrations of about from 5 to 12 weight % have been found to be particularly satisfactory, and are accordingly preferred. The white pigment used can be selected from those typically used for white pigmentation, including titanium dioxide ($TiO_2$) and barium sulfate ($BaSO_4$). Of these, titanium dioxide is preferred for its ready availability. Such pigmentation can also include mica or a component that adds pearlescence. The white pigment facilitates the lamination process, providing pathways for the gas generated in the course of lamination to escape. In addition, the white pigment results in increased optical density and reflectivity of the laminate. This, in turn, increases the power generation of photovoltaic cells for which the laminate is used for a protective layer.

It is known that the properties of EVA copolymer vary significantly with the content of vinyl acetate (VA). With a VA content in EVA of up to 10 wt. %, the polymer maintains the crystalline structure, is flexible and tough and its Vicat softening point is about 95° C.

When the VA content is increased, the EVA copolymer gets softer due to decreased crystallinity, the product becomes rubber elastic and the ultimate tensile strength passes through a maximum. Also, the storage modulus is decreased and the polymer becomes flexible. Between 15 and 30 wt.-percent VA, the products are comparable with plasticized PVC. They are soft and flexible. Polymers with 30 to 40 wt. % VA are soft, elastic and highly fillable. Increasing the VA content above 40% results in a substantially completely amorphous material. The properties of EVA with higher levels of VA, such as heat resistance, stress crack resistance, and behavior under long-period stressing, can be significantly improved by cross-linking. Such EVA compositions with higher VA concentrations change from solid to a fluid at 80° C. in 2.5 minutes, becoming solid again when EVA cross-linking starts and the temperature goes beyond 130° C.

To attain the desired reflectivity, white pigmented polyvinyl fluoride (such as that commercially available from DuPont as Tedlar® polyvinyl fluoride) can be used as the second outer layer. This is preferably coated with thin light reflecting film containing about from 20 to 60 weight percent of white pigment, preferably about from 40 to 50 weight percent of white pigment. The white pigment used can be selected, for example, from titanium dioxide, lithopone, zinc sulfide, zinc oxide, fluorescent whitening agents, and metal flakes.

The matrix for the thin light reflecting coating can be selected from a wide variety of polymers, such as acrylic polymers, urethane, polyesters, fluoropolymers, chlorofluoropolymers, epoxy polymers, polyimides, latex, thermoplastic elastomers, and ureas. The Thin light reflecting coating can be applied to the second outer layer by any of a variety of methods known to those skilled in the art of film coating manufacture. Preferred methods include coating application by spraying, dipping and brushing.

The second outer layer of the laminates of the present invention can also be prepared from chlorotrifluoroethylene-vinylidene fluoride copolymer (CTFE/VDF), ethylene-chlorotrifluoroethylene copolymer (ECTFE), ethylene-tetrafluoroethylene copolymer (ETFE), fluorinated ethylene-propylene copolymer (FEP), polychlorotrifl uoroethylene (PCTFE), perfluoroalkyl-tetrafl uoroethylene copolymer (PFA), polytetrafluoroethylene (PTFE), polyvinylidene fluoride (PVDF), tetrafluoroethylene-hexafluoropropylene copolymer (TFE/HFP), hexafluoropropylene-vinylidene fluoride copolymer (HFP/VDF), tetrafluoroethylene-propylene copolymer (TFE/P), tetrafluoroethylene-perfluoromethylether copolymer (TFE/PFMe), perfluorinated polyethers, styrenic polymers designed for use in outdoor applications, copolymers of cycloolefines, polyurethane, polyvinyl chloride and its copolymers, polyolefin homopolymers and copolymers, copolymer of ethylene and vinyl acetate, polyamides, synthetic rubber and its copolymers, silicon rubber, polyimides, polyetherimides, fluorine-containing polyimides, polycarbonates, ionomers and their compositions, ionomer/polyamide compositions, esters and copolymers of polyacrylic acid, esters and copolymers of polymethacrylic acid. Of these, PVF, CTFE/VDF, ECTFE, PCTFE, PVDF and polyolefin homopolymers and copolymers are preferred.

The individual layers of the laminates of the present invention can be adhesively bonded together. The specific means of forming the laminates of the present invention will vary according to the composition of the layers and the desired properties of the resulting laminate, as well as the end use of the laminate.

Preferably, each of the layers is bonded together by applying an adhesive to one layer and attaching another layer, and repeating the process as necessary, depending on the number of layers. Various adhesives can be used to fabricate the laminates of the present invention, including those presently known and used for adhering layers of other laminates together. The particular adhesive that can be used will vary according to the composition of the layers and the intended use of the laminate.

Preferred adhesives include (I) formulations comprising 600 parts by weight of polyester adhesive blend, 100 parts by weight of methylethyl ketone (MEK), and 100 parts by weight of toluene; and (II) formulations comprising 535 parts by weight of polyurethane adhesive blend, 200 parts by weight of MEK, 200 parts by weight of toluene, and 0.22 parts by weight of hydrolytic stabilizer. The above preferred adhesive formulations are both about 24% non-volatile and are typically coated onto a layer of the laminate at about from 7 to 10 grams per square meter, resulting in a final adhesive layer thickness of about from 0.25 mils to 0.5 mils, depending on the density of the adhesive.

In the broadest sense, fabrication of the laminates of the present invention typically involves four steps which can be repeated according to the number of layers used to form a desired laminate. These steps are (1) coating a layer of the laminate with an adhesive, typically dissolved in a solvent carrier; (2) drying the coated layer; (3) conditioning the layer to be laminated to the coated layer; and (4) laminating the coated layer to the conditioned layer. These four steps result in an intermediate laminate, and the thus obtained intermediate laminate is then processed according to the above four steps to obtain a laminate of the present invention. The above process of forming an intermediate laminate that can be used to obtain a laminate of the present invention can be repeated, and the number of times this process is used will vary according to the desired final product. For example, a four layer laminate of the present invention, comprising two mid-layers, can be formed by repeating the above process three times.

The coating step of the process of fabricating laminates of the present invention can vary, including known methods of applying laminating adhesives to films that will form layers of a laminate. The coating can be carried out by any conventional means, such as spray, roll, knife, curtain, or gravure coaters, or any method that permits the application of a uniform coating without streaks or other defects. Variations and modifications to the coating step described herein will be apparent to those skilled in the art, and are within the scope of the present invention. For all laminates of the present invention, the first step is applying an adhesive, preferably of the type and formulation discussed above, to the first outer layer for the laminate.

Preferably, the adhesive is applied to the first outer layer of the laminate rather than the at least one mid-layer, because the PVF preferred for this layer is easier to process than most of the possible mid-layers of the present invention. Many of the mid-layers of the present invention, especially those formed from thin sheets of liquid crystal polymer, can be negatively affected by repeated processing through the rollers used to manipulate the layer and apply the adhesive, and by the tension forces that result from such processing. In addition, in the fabrication of laminates having a second outer layer of EVA, which can be affected by the solvent used to apply the adhesive, the adhesive should be applied to the PVF layer face of the intermediate laminate. Accordingly, because a first outer layer of PVF is stronger, more durable, and more resistant to processing than any of the possible mid-layers, it is preferred that this layer be processed first.

According to the first step of the process of fabricating a laminate of the present invention, a preferred adhesive of either formulation I or II described above is applied to the first outer layer using either a comma coater or a roll applicator with a Mayer Rod metering system. The adhesive is generally controlled to 7 to 10 grams per square meter dry. The adhesive is applied in liquid form, usually carried in a solvent. The solvents that can be used in fabricating laminates of the present invention include most organic solvents. Of these, MEK and toluene are preferred.

After applying a laminating adhesive to the first outer layer as described above, the coated first outer layer is dried, then passed through a multi zone oven to evaporate solvents from the coating. One possible set of oven settings for this step of the fabrication process can be: Zone 1=120° F., Zone 2=140° F., and Zone 3=175° F. These settings are typical for this phase of fabrication, especially when the desired laminate comprises the components in Example 1 below. The drying step can also occur as the coated layer is passed around heated rollers.

The drying step is typically followed by conditioning the film or layer to be laminated to the first outer layer. It is preferred that the film or layer to be laminated be conditioned while the first outer layer is being dried. If there is an inconsistency in the film thickness, the film can be heated by a series of hot rollers in order to smooth it and remove any defects, equalize any variations in thickness or formation, and otherwise improve the quality and consistency of the film.

Additional conditioning can include corona treatment according to any known process. Corona treatment of the film to be laminated is preferred for CTFE and LCP mid-layer films, because this process places additional oxygen on the surface of the film and increases surface energy to improve the bond of the laminating adhesive, and thus improve the bond of the at least one mid-layer to the first outer layer of PVF.

After the coated first outer layer of PVF has been dried, and the at least one mid-layer has been conditioned, the two layers are laminated. According to this process step, the two films are fed into a laminating nip. Typically, a laminating nip comprises a heated chrome roll and a rubber backing roll between which lamination takes place. Typical laminating temperatures can be about 250-350° F., but can vary with the desired laminate components, the adhesive used, and other factors, which will be evident to those skilled in the art. The laminating roll pressure, which also depends on similar variables, including the particular films used and their thicknesses, can vary about from 50 psi to 250 psi. After the layers have been laminated, the resulting intermediate laminate should be cured and can be wound for storage and in preparation for being reprocessed. The curing time and conditions will also vary according to many factors, including the thickness of the layers and resulting laminate, the composition of the films used to obtain the laminate, the adhesive used to bond the layers, and the environment in which the intermediate laminate is cured.

Subsequent laminations to form a laminate of the present invention are performed in the same manner as described above. In embodiments where the second outer layer is formed from EVA, the coating process involves coating the intermediate laminate rather than the EVA layer, because the EVA layer can be affected by the solvents that carry the adhesive. Accordingly, in such embodiments of a laminate of the present invention, it is also preferred that the adhesive be applied to the PVF side of the intermediate layer.

Line speeds for the above process will depend on the processing machinery used, as well as the characteristics of the films used to obtain the laminate. Typical line speeds for the type of lamination process described above can be about 100-120 feet per minute, with a dwell time of about 45 seconds. The dwell time can include the time spent in the multi zone oven, and at other stages in the fabrication process.

The laminates of the present invention can be formed in any dimensions, depending on the parameters of the processing equipment and the availability and cost of component film layers having the desired dimensions. Typically, the laminates of the present invention are about from 24 to 100 inches wide. In photovoltaic applications, the desired width is about from 50 to 60 inches, however, the width will typically be that which can be used most efficiently. For example, if there were a demand for laminate having a width of 29 inches, a laminate having a width of 50 inches would result in unnecessary waste, and a 60 inch wide laminate would provide the most efficient dimensions.

The laminates of the present invention can be used as simple and cost-effective protective backing sheets for photovoltaic modules, as opposed to solar batteries. A battery is a device that stores energy. Even if a solar battery derives its power from its own cells, it does not need to function at all times, only when the battery needs power. A PV module, by comparison, only generates power and sends it to a battery or, with an inverter, to the power grid. The laminates of the present invention can be used in various electronic applications, most notably as a barrier protecting the encapsulant in photovoltaic modules. The laminates of the present invention are resistant to breakdown effects associated with exposure to environmental conditions, including UV and other bands of sunlight, heat, moisture, and electrical forces. The opacity and high concentration of white pigment in the EVA in the second outer layer provides excellent protection for the polyester mid-layer as well as increased permeability for gasses generated in the lamination process. In the use of the instant laminates for the protection of photovoltaic cells, the first outer layer of the laminate should be positioned to be the outer layer of the photovoltaic cell construction. The EVA in the second outer layer provides especially good bond strength to the encapsulants typically used for photovoltaic cells. The high concentration of the white pigment in the second outer layer of the laminate, when adjacent to the photovoltaic cells, also results in increased reflectivity of the construction, which results in higher power generation of the photovoltaic cells.

The use of the present pigmented laminates as protective backing sheets in PV modules increases reflectivity, still leaving the surface of the cells exposed to incident light. In these applications, encapsulant is not used. If backside encapsulant is pigmented white, during vacuum laminating, some of that white encapsulant will flow onto the cell surface, decreasing the incident light on the cell and reducing its power generation.

When the present laminates are used as protective backing sheets for a PV module, the use of the laminates will result in a number of advantages:
1. boost the power output of the module
2. maximize the pathways for gases formed during the lamination process
3. the module laminate will remain aesthetically satisfactory over extended use
4. the laminate will provide effective protection for the current generated in a the PV module
5. the laminate will exhibit high dielectric strength According to the above general process parameters, a wide variety of laminates of the present invention can be fabricated. The following Examples illustrate several possible embodiments of the laminates of the present invention. For the sake of brevity and clarity, these embodiments are limited to three layer laminates, however, the invention is not limited to such laminates, and it will be clear to those skilled in the art how to repeat the fabrication process to obtain laminates of the present invention having more than three layers.

EXAMPLE 1 AND COMPARATIVE EXAMPLE A

In Example 1, a laminate of the present invention is prepared having a first outer layer of PVF having a thickness of 22.5 micrometers. An adhesive of formulation I described above is applied to the first outer layer of PVF using a comma coater. The adhesive is controlled to 9 grams per square meter dry. The coated first outer layer is then dried to remove the solvent. A layer of polyethylene terephthalate having a thickness of 2 mils is then laminated to the PVF. The resulting intermediate laminate is then reprocessed according to the above and laminated to a second outer layer of EVA having a vinyl acetate content of thickness of 4 mils to obtain a laminate of the present invention. The EVA layer contained 5.5 weight % titanium dioxide pigment, and was substantially opaque to ultraviolet light. A cross section of the laminate of Example 1 is shown in FIG. 1.

In Comparative Example A, the general procedure of Example 1 was repeated, except that the second outer layer contained no pigment.

The laminates were tested as backings for photovoltaic cells by bonding the second outer layer to the surface of a photovoltaic cell. The reflectivity of both Example 1 and Comparative Example A were tested, and the laminates of Example 1 were found to result in greater reflectivity. Photovoltaic cells using the laminate of Example 1 exhibited 1-1.5% higher power generation than those of Comparative Example A.

EXAMPLES 2-5

The general procedure of Example 1 is repeated, except that the mid-layer is poly(chlorotrifluoro ethylene), polymeric film coated on both surfaces with liquid crystal polymer, liquid crystal polymer and metal foil in Examples 2, 3, 4 and 5, respectively. If the resulting laminates are tested as before with photovoltaic cells, similar performance characteristics will be obtained.

Figure 2:
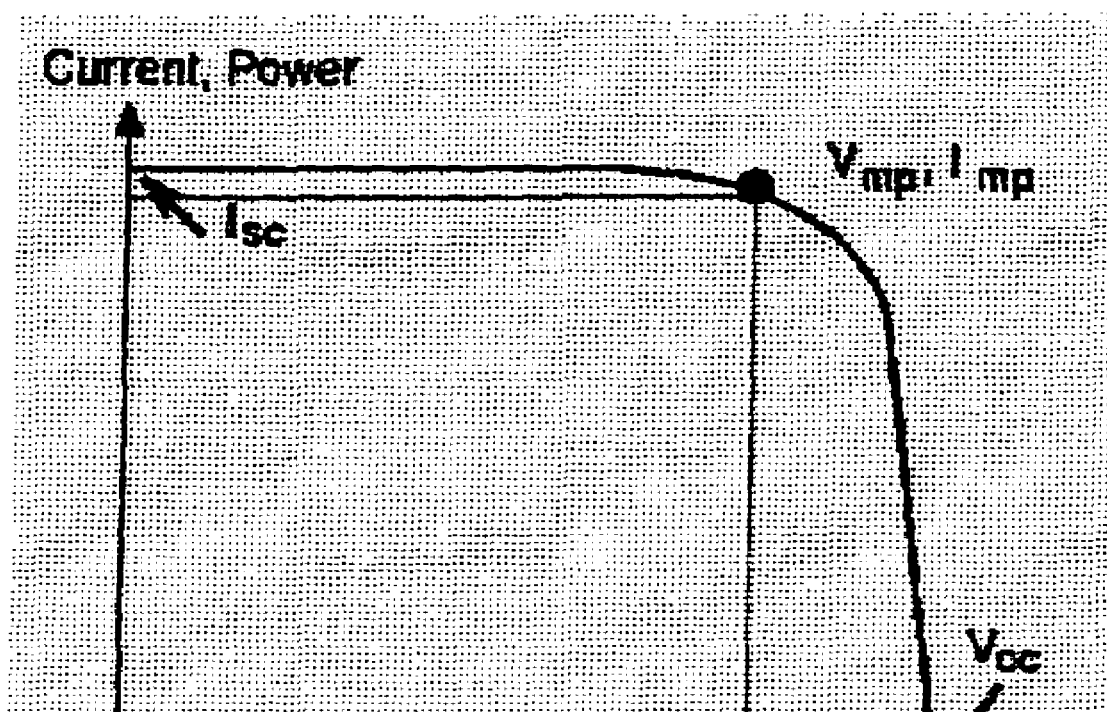
FIG. 2 is a graphical representation of the performance characteristics of laminates of the present invention.

Testing of the modules for electrical power output was conducted by illuminating each module with a solar simulator light source and measuring the short-circuit current (Isc). The performance of solar cells and modules can be described by their current vs voltage characteristic (I-V). The typical I-V curve is presented in FIG. 2. The critical parameters on the I-V curve are the open-circuit voltage (Voc), the short-circuit current (Isc) and the maximum power-point (Pmax). Isc, the maximum current at zero voltage, is directly proportional to the available sunlight. Voc can be determined from a linear fit to the I-V curve around the zero current point. Pmax is an electrical output when operated at a point where the product of current and voltage is at maximum.

$$Pmax = ImpVmp$$

The Fill Factor, FF, is a measure of the squareness of the I-V characteristics. It is the ratio of maximum power to the product of Isc and Voc.

$$FF = \frac{Pmax}{VocIsc}$$

The power conversion efficiency, $\acute{\eta}$. is defined as $$\acute{\eta} = \frac{Pmax}{Pin} = \frac{FFVocIsc}{Pin}$$

where Pin is an incident radiant power. It is determined by the properties of the light spectrum incident upon the solar cell The resulting I-V curve is shown I FIG. 2.

The module made with the TPE bright white backskin, as depicted in Table 1, showed a short circuit current increase of about 3% over the module with TPE black backskin.

TABLE 1

Effect of pigmentation on solar cells performance

| Back Skin | Isc, amp | Reflectivity |
|---|---|---|
| TPE White | 5.22 | 87.8 |
| TPT Enhanced | 5.18 | 80.6 |
| TPT | 5.16 | 75.4 |
| TPE Black | 5.05 | 4.9 |

We claim:

1. A laminate comprising, and bonded together in the order specified,
   (a) a first outer layer of weatherable film;
   (b) at least one mid-layer selected from at least one of the group consisting of (i) poly(chlorotrifluoro ethylene), (ii) polymeric film coated on one or both surfaces with liquid crystal polymer, (iii) liquid crystal polymers; (iv) metal foil; and (v) polyester; and
   (c) a second outer layer having a reflectivity of at least about 75.0% wherein the second outer layer is a polymer bearing a light reflecting coating on the outer surface thereof, and wherein the polymer of the second outer layer comprises ethylene vinyl acetate and a white pigment and the light reflecting coating comprises a white pigment and fluorescent whitening agent.

2. A laminate of claim 1 wherein the second layer has a thickness of about from 50 to 200 microns.

3. A laminate of claim 2 wherein the ethylene vinyl acetate comprises about from 2 to 33 percent by weight of vinyl acetate.

4. A laminate of claim 3 wherein the ethylene vinyl acetate comprises about from 2 to 8 percent by weight of vinyl acetate.

5. A laminate of claim 1 wherein the mid-layer consists essentially of polyester.

6. A laminate of claim 1 wherein the mid-layer consists essentially of polyester film coated on one or both surfaces with polyvinylidene chloride.

7. A laminate of claim 1 wherein the mid-layer consists essentially of polyester film coated on one or both surfaces with liquid crystal polymer.

8. A laminate of claim 1 wherein the mid-layer consists essentially of liquid crystal polymer.

9. A solar panel comprising a plurality of photovoltaic cells and a laminate of claim 1.

10. A solar panel of claim 9 wherein the second out surface of the laminate is bonded to the solar panel.

11. A laminate of claim 1 wherein the light reflecting coating comprises from 20 to 60 weight percent of white pigment.

12. A laminate of claim 1 wherein the light reflecting coating is applied to the second outer layer by one of spraying, dipping and brushing.

* * * * *